(12) United States Patent
Takaya et al.

(10) Patent No.: US 9,640,651 B2
(45) Date of Patent: May 2, 2017

(54) SEMICONDUCTOR DEVICE AND METHOD OF MANUFACTURING SEMICONDUCTOR DEVICE

(71) Applicants: Hidefumi Takaya, Toyota (JP); Jun Saito, Nagoya (JP); Akitaka Soeno, Toyota (JP); Kimimori Hamada, Toyota (JP); Shoji Mizuno, Okazaki (JP); Sachiko Aoi, Nagoya (JP); Yukihiko Watanabe, Nagoya (JP)

(72) Inventors: Hidefumi Takaya, Toyota (JP); Jun Saito, Nagoya (JP); Akitaka Soeno, Toyota (JP); Kimimori Hamada, Toyota (JP); Shoji Mizuno, Okazaki (JP); Sachiko Aoi, Nagoya (JP); Yukihiko Watanabe, Nagoya (JP)

(73) Assignees: TOYOTA JIDOSHA KABUSHIKI KAISHA, Toyota (JP); DENSO CORPORATION, Kariya (JP)

( * ) Notice: Subject to any disclaimer, the term of this patent is extended or adjusted under 35 U.S.C. 154(b) by 0 days.

(21) Appl. No.: 15/116,288

(22) PCT Filed: Oct. 6, 2014

(86) PCT No.: PCT/JP2014/076722
§ 371 (c)(1),
(2) Date: Aug. 3, 2016

(87) PCT Pub. No.: WO2015/118721
PCT Pub. Date: Aug. 13, 2015

(65) Prior Publication Data
US 2017/0012122 A1    Jan. 12, 2017

(30) Foreign Application Priority Data
Feb. 10, 2014    (JP) .................................. 2014-023869

(51) Int. Cl.
*H01L 29/94* (2006.01)
*H01L 29/78* (2006.01)
(Continued)

(52) U.S. Cl.
CPC ........ *H01L 29/7811* (2013.01); *H01L 21/761* (2013.01); *H01L 29/0623* (2013.01);
(Continued)

(58) Field of Classification Search
CPC ........... H01L 29/7811; H01L 29/66734; H01L 29/0623; H01L 29/7813
(Continued)

(56) References Cited

U.S. PATENT DOCUMENTS 8,372,717 B2 *   2/2013   Hsieh .................. H01L 29/0634
                                                   257/E21.41
2013/0075760 A1 *   3/2013   Takaya ................ H01L 29/0623
                                                   257/77
(Continued)

FOREIGN PATENT DOCUMENTS

JP        H07-142713 A    6/1995
JP        H11-87698 A     3/1999
(Continued)

*Primary Examiner* — David Vu
*Assistant Examiner* — Brandon Fox
(74) *Attorney, Agent, or Firm* — Oliff PLC

(57) ABSTRACT

A semiconductor device includes a termination trench surrounding a region in which a plurality of gate trenches is provided; a p-type lower end region being in contact with a lower end of the termination trench; a p-type outer circumference region being in contact with the termination trench from an outer circumferential side and exposed on a surface of the semiconductor device; a plurality of guard ring regions of a p-type provided on an outer circumferential side of the p-type outer circumference region and exposed on the surface; and an n-type outer circumference region separating (Continued)

the p-type outer circumference region from the guard ring regions and separating the guard ring regions from each another.

7 Claims, 15 Drawing Sheets

(51) Int. Cl.
    *H01L 29/06*     (2006.01)
    *H01L 29/66*     (2006.01)
    *H01L 21/761*     (2006.01)
    *H01L 29/16*     (2006.01)

(52) U.S. Cl.
    CPC .... *H01L 29/1608* (2013.01); *H01L 29/66068* (2013.01); *H01L 29/7813* (2013.01)

(58) Field of Classification Search
    USPC .................................................. 257/330, 331
    See application file for complete search history.

(56) References Cited

U.S. PATENT DOCUMENTS

2016/0133741 A1*   5/2016   Matsuki .............. H01L 29/7813
                                                                             257/77
2016/0172437 A1*   6/2016   Masuda .............. H01L 29/0619
                                                                             257/494

FOREIGN PATENT DOCUMENTS

| JP | 2008-135522 A | 6/2008 |
| JP | 2012-004312 A | 1/2012 |
| JP | 2013-191734 A | 9/2013 |

\* cited by examiner

SEMICONDUCTOR DEVICE AND METHOD OF MANUFACTURING SEMICONDUCTOR DEVICE

TECHNICAL FIELD

Cross-Reference to Related Application

This application claims priority to Japanese Patent Application No. 2014-023869 filed on Feb. 10, 2014, the entire contents of which are hereby incorporated by reference into the present application.

The art disclosed herein relates to a semiconductor device.

BACKGROUND ART

A semiconductor device disclosed in Japanese Patent Application Publication No. 2008-135522 A includes a MOSFET and a plurality of termination trenches provided around the MOSFET. Each of the termination trenches extends in such an annular shape as to surround a region in which the MOSFET is provided. An insulating layer is provided in each of the termination trenches. A p-type floating region is provided in a range of a semiconductor layer which is in contact with a bottom surface of each of the termination trenches. When the MOSFET is turned off, a depletion layer extends from a body region of the MOSFET toward an outer circumferential side (i.e. a region in which the termination trenches are provided). Once the depletion layer extends to the p-type floating region below an innermost termination trench, the depletion layer further extends from the p-type floating region toward the outer circumferential side. Due to this, once the depletion layer extends to an adjacent p-type floating region, the depletion layer further extends from the p-type floating region toward the outer circumferential side. Thus passing through each of the p-type floating regions, the depletion layer widely spreads around the region in which the MOSFET is provided. This allows the semiconductor device to have a higher withstand voltage.

SUMMARY OF INVENTION

Technical Problem

In recent years, there has been a growing demand for a higher withstand voltage of the aforementioned type of semiconductor device. Conventionally, the aforementioned p-type floating regions are formed by implanting p-type impurities into bottom surfaces of termination trenches after having formed the termination trenches and then diffusing the implanted p-type impurities within the semiconductor layer. However, depending on a semiconductor material and other various manufacturing process conditions, the p-type impurities may in some case only be diffused over a short distance, with a result that the p-type floating regions cannot be placed at sufficiently narrow intervals. In such a case, it is difficult for a depletion layer to sufficiently extend to regions located in the intervals. It is conceivable to narrow the intervals between the p-type floating regions by narrowing intervals between the termination trenches. However, problems with processing accuracy and the like put limitations on the narrowing of the intervals between the termination trenches. The conventional structure of termination trenches has been limited in improvement of the withstand voltage. In view of this, the present disclosure discloses a semiconductor device that is capable of achieving a higher withstand voltage.

Solution to Technical Problem

The present disclosure discloses a semiconductor device that comprises a semiconductor substrate. The semiconductor device comprises: a first region of an n-type provided in the semiconductor substrate and exposed on a surface of the semiconductor substrate; a second region of a p-type provided below the first region; a third region of the n-type provided below the second region and separated from the first region by the second region; a plurality of gate trenches provided in the surface, penetrating the first region and the second region, and reaching the third region; first insulating layers provided in the gate trenches; gate electrodes provided in the gate trenches and facing the second region via the first insulating layers; fourth regions of the p-type being in contact with lower ends of the gate trenches; a termination trench provided in the surface and extending so as to surround a region in which the plurality of gate trenches is provided in a planar view of the surface; a second insulating layer provided in the termination trench; a p-type lower end region of the p-type being in contact with a lower end of the termination trench; a p-type outer circumference region of the p-type provided on an outer circumferential side of the termination trench, being in contact with the termination trench, and exposed on the surface; a plurality of guard ring regions of the p-type provided on the outer circumferential side of the p-type outer circumference region and exposed on the surface; and an n-type outer circumference region of the n-type provided on the outer circumferential side of the termination trench, connected to the third region, separating the p-type outer circumference region from the guard ring regions, and separating the guard ring regions from each another.

It should be noted that the term "outer circumferential side" as used herein means a direction away from a region in which the plurality of gate trenches is provided. Further, the aforementioned p-type lower end region may be connected to or separated from the aforementioned p-type outer circumference region.

In this semiconductor device, the first region, the second region, the third region, the fourth regions, and the gate electrodes form a switching element. When the switching element is turned off, a depletion layer spreads from the second region into the third region. Once the depletion layer reaches lower ends of the gate trenches, the depletion layer reaches the fourth regions. Then, the depletion layer also spreads from the fourth regions into the third region. This ensures a withstand voltage in a region in which the switching element is provided. Further, once the depletion layer, which spreads from the second region into the third region, reaches the lower end of the termination trench, the depletion layer reaches the p-type lower end region. Then, the depletion layer extends from the p-type lower end region and the p-type outer circumference region into the n-type outer circumference region. Once the depletion layer, which extends from the p-type outer circumference region, reaches a guard ring region adjacent to the p-type outer circumference region, the depletion layer further extends from the guard ring region toward an adjacent guard ring region. The depletion layer spreads toward the outer circumferential side via each of the guard ring regions. Due to this, the depletion layer widely extends to a region on the outer circumferential side, ensuring a withstand voltage. Thus, in this semiconductor device, the extension of the depletion layer can be promoted by the guard ring regions exposed on the surface of the semiconductor substrate. Further, since the guard ring regions are provided in a region exposed on the surface of the semiconductor substrate, the guard ring regions can be formed with a high degree of accuracy. This makes it possible to easily narrow the intervals between the guard ring regions. For this reason, in this semiconductor device, a sufficient withstand voltage can be ensured by the guard ring regions.

In the aforementioned semiconductor device, a step portion may be provided on the surface so that the surface comprises a first surface and a second surface projecting from the first surface. The termination trench may be provided in the second surface. The p-type outer circumference region may be exposed in a range extending across the second surface and the first surface. The plurality of guard ring regions may be exposed on the first surface. Further, in this case, an interval between the termination trench and the step portion may be equal to or more than 10 μm.

In any of the aforementioned semiconductor devices, the p-type outer circumference region may include an Al high density region and a B high density region. The Al high density region may be located in a region at an outer circumferential side end portion of the p-type outer circumference region and exposed on the surface, and have a density of Al higher than a density of B. The B high density region may be adjacent to the Al high density region and have a density of B higher than a density of Al. In this case, a width of the Al high density region may be wider than a width of each of the guard ring regions. It should be noted that the width means a dimension in a direction from an inner circumferential side toward the outer circumferential side.

Such a configuration makes it possible to suppress a leak current in the p-type outer circumference region.

In any of the aforementioned semiconductor devices, a part of the p-type lower end region may extend in a range provided on an inner circumferential side of the termination trench. The part of the p-type lower end region extending in the range provided on the inner circumferential side of the termination trench may not have to extend to an upper side with respect to the lower end of the termination trench.

In any of the aforementioned semiconductor devices, the guard ring regions may contain Al.

Such a configuration makes it possible to form the guard ring regions with a higher degree of accuracy.

The aforementioned semiconductor device including the step portion may be manufactured by a following method. This method comprises steps of: growing a p-type layer on an n-type layer; removing a part of the p-type layer so as to form a surface on which the n-type layer is exposed and a surface on which the p-type layer is exposed and projecting from the surface on which the n-type layer is exposed; implanting p-type impurities in a range extending across the surface on which the n-type layer is exposed and the surface on which the p-type layer is exposed so as to form the p-type outer circumference region; implanting p-type impurities into the surface on which the n-type layer is exposed so as to form the guard ring regions; and forming the termination trench in the surface on which the p-type layer is exposed.

DESCRIPTION OF EMBODIMENTS

Figure 1:
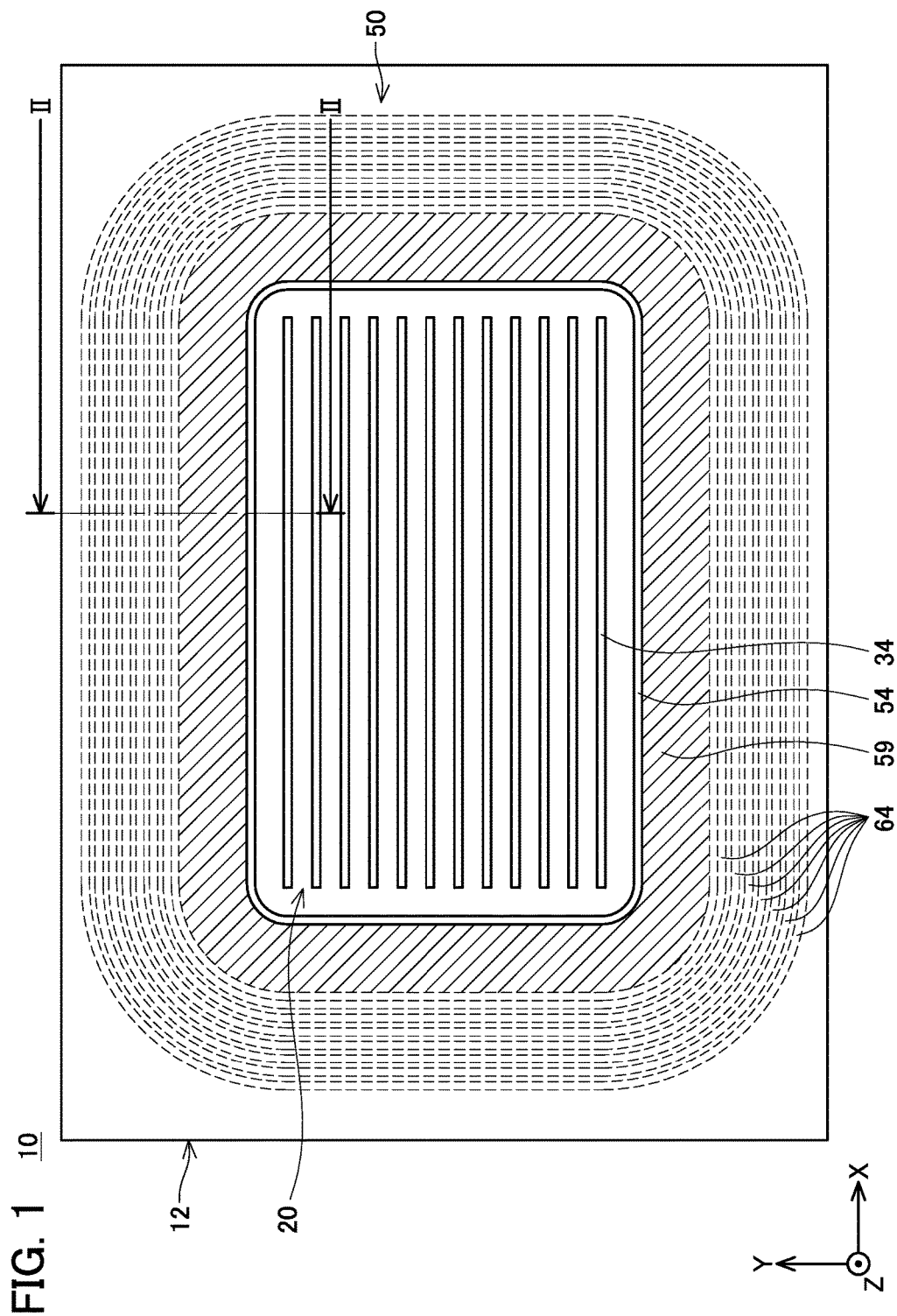
FIG. 1 is a plan view of a semiconductor device 10.

As shown in FIG. 1, a semiconductor device 10 according to Embodiment 1 includes a semiconductor substrate 12 being a substrate constituted of SiC (silicon carbide). The semiconductor substrate 12 includes a MOSFET region 20 and an outer circumference region 50. The MOSFET region 20 comprises a MOSFET. It should be noted that, for the sake of viewability, FIG. 1 shows only gate trenches 34 in the MOSFET region 20. The outer circumference region 50 is a region located outside of the MOSFET region 20. In Embodiment 1, the outer circumference region 50 is a region located between the MOSFET region 20 and an end face 12a of the semiconductor substrate 12. The outer circumference region 50 comprises a withstand-voltage structure. It should be noted that, for the sake of viewability, FIG. 1 shows only a termination trench 54, a p-type boundary region 59, and guard ring regions 64 in the outer circumference region 50.

Figure 2:
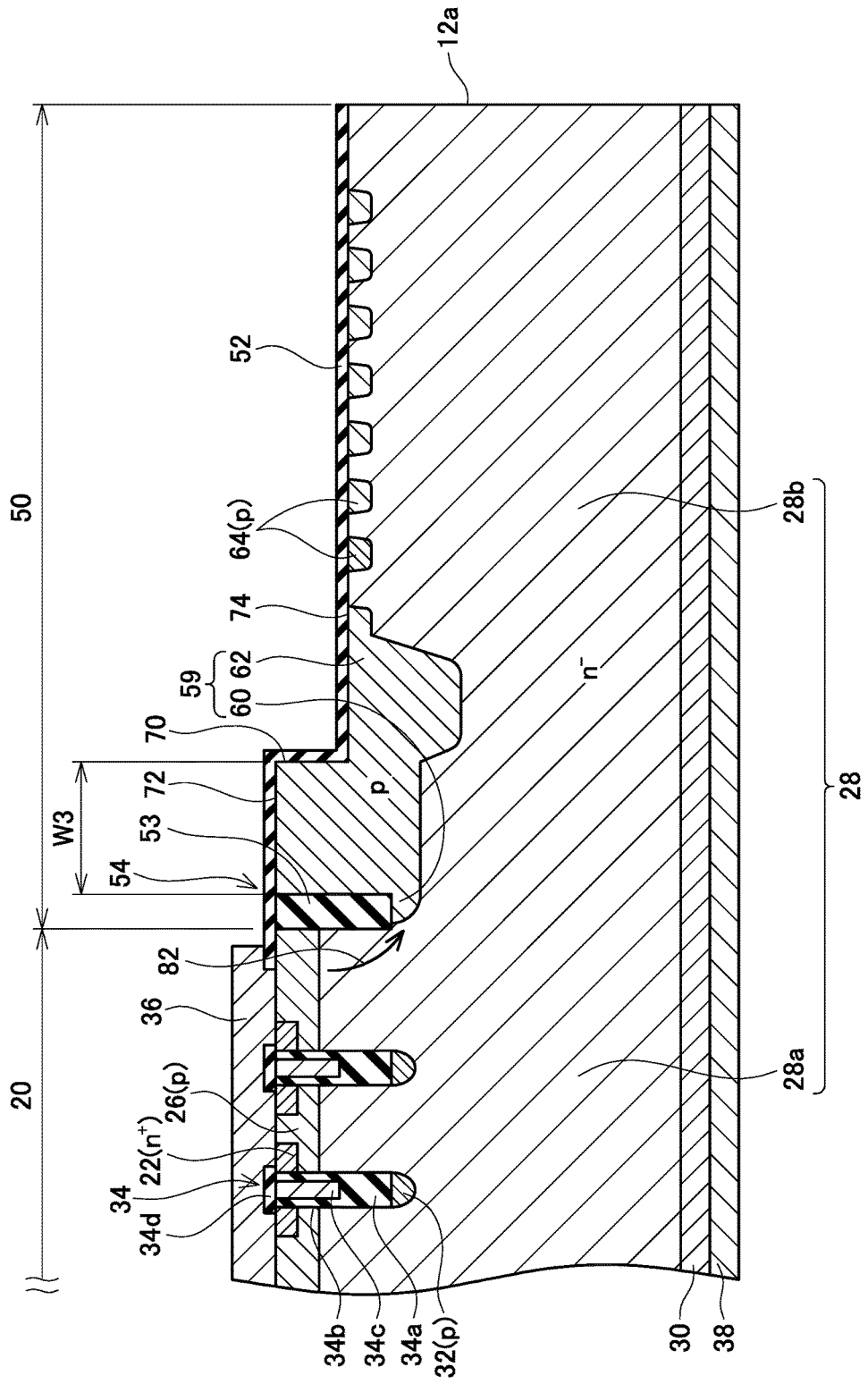
FIG. 2 is a longitudinal section view taken along line II-II in FIG. 1.

As shown in FIG. 2, the MOSFET region 20 comprises a source region 22, a body region 26, a drift region 28, a drain region 30, p-type floating regions 32, gate trenches 34, a source electrode 36, and a drain electrode 38.

A plurality of the source regions 22 is provided, in the MOSFET region 20. Each of the source regions 22 is an n-type region containing a high density of n-type impurities. The source regions 22 are provided in ranges exposed on an upper surface of the semiconductor substrate 12.

The body region 26 is provided lateral to and below the source regions 22, and is in contact with the source regions 22. The body region 26 is a p-type region. The body region 26 is exposed on the upper surface of the semiconductor substrate 12 in a position where no source region 22 is provided.

The drift region 28 is an n-type region containing a low density of n-type impurities. The drift region 28 has a lower n-type impurity density than the source regions 22. The drift region 28 is provided under the body region 26. The drift region 28 is in contact with the body region 26, and is separated from the source regions 22 by the body region 26.

The drain region 30 is an n-type region containing a high density of n-type impurities. The drain region 30 has a higher n-type impurity density than the drift region 28. The drain region 30 is provided below the drift region 28. The drain region 30 is in contact with the drift region 28, and is separated from the body region 26 by the drift region 28. The drain region 30 is provided in a range exposed on a lower surface of the semiconductor substrate 12.

A plurality of the gate trenches 34 is provided in the MOSFET region 20. Each of the gate trenches 34 is a groove formed in the upper surface of the semiconductor substrate 12. Each of the gate trenches 34 penetrates the corresponding source region 22 and the body region 26 and reaches the drift region 28. As shown in FIG. 1, the plurality of the gate trenches 34 extends parallel to each other. As shown in FIG. 2, a bottom insulating layer 34a, a gate insulating film 34b, and a gate electrode 34c are provided in each of the gate trenches 34. The bottom insulating layer 34a is a thick insulating layer provided at a bottom portion of the trench gate 34. The gate insulating film 34b covers a side surface of the gate trench 34 above the bottom insulating layer 34a. The gate electrode 34c is provided in an inner part of the gate trench 34 above the bottom insulating layer 34a. The gate electrode 34c faces the corresponding source region 22, the body region 26, and the drift region 28 with the gate insulating film 34b interposed therebetween. The gate electrode 34c is insulated from the semiconductor substrate 12 by the gate insulating film 34b and the bottom insulating layer 34a. An upper surface of the gate electrode 34c is covered with an insulating layer 34d.

Each p-type floating regions 32 is provided in a range in the semiconductor substrate 12 which is in contact with a bottom surface (i.e. a lower end) of the corresponding gate trench 34. A periphery of each of the p-type floating regions 32 is surrounded by the drift region 28. The p-type floating regions 32 are separated from each other by the drift region 28. Further, each of the p-type floating regions 32 is separated from the body region 26 by the drift region 28.

The source electrode 36 is provided on the upper surface of the semiconductor substrate 12 in the MOSFET region 20. The source electrode 36 conducts with the source regions 22 and the body region 26.

The drain electrode 38 is provided on the lower surface of the semiconductor substrate 12. The drain electrode 38 conducts with the drain region 30.

The aforementioned drift region 28 and drain region 30 extend over to the outer circumference region 50. The drift region 28 and the drain region 30 spread to the end face 12a of the semiconductor substrate 12. Further, the drain electrode 38 is provided on the entire lower surface of the semiconductor substrate 12 including the outer circumference region 50. Further, the upper surface of the semiconductor substrate 12 in the outer circumference region 50 is covered with an insulating layer 52. The drift region 28 in the MOSFET region 20 may be hereinafter referred to as "element drift region 28a", and the drift region 28 in the outer circumference region 50 may be hereinafter referred to as "outer circumference drift region 28b".

A step portion 70 is provided on a surface of the semiconductor substrate 12 in the outer circumference region 50. The step portion 70 divides the surface of the semiconductor substrate 12 into a surface 72 on a center side and a surface 74 on an end face 12a side. The surface 72 projects to an upper side with respect to the surface 74. For this reason, the semiconductor substrate 12 is greater in thickness in a portion thereof corresponding to the surface 72 than in a portion thereof corresponding to the surface 74. The aforementioned MOSFET region 20 is provided in the portion corresponding to the surface 72 (i.e. the portion that in greater in thickness). A height of the step portion 70 is greater than a thickness of the body region 26. Therefore, the surface 74 is located on a lower side (i.e. a back surface side) than a lower end of the body region 26.

The termination trench 54 is provided in the surface 72 of the semiconductor substrate 12 in the outer circumference region 50. An insulating layer 53 is provided in the termination trench 54. The termination trench 54 is provided in a position bordering the body region 26. The termination trench 54 has substantially the same depth as the gate trenches 34. Therefore, the insulating layer 53 is in contact with the element drift region 28a in a position deeper than the body region 26. As shown in FIG. 1, the termination trench 54 extends so as to surround an entire periphery of the MOSFET region 20 in a planar view of the surface of the semiconductor substrate 12. Therefore, the body region 26 is separated from any of the p-type regions in the outer circumference region 50 by the insulating layer 53. That is, in the present embodiment, the MOSFET region 20 is a region surrounded by the termination trench 54.

As shown in FIG. 2, a p-type lower end region 60 is provided in a position in contact with a lower end (i.e. a bottom surface) of the termination trench 54. In the present embodiment, the p-type lower end region 60 is not provided in the MOSFET region 20. Further, an p-type outer circumference region 62 is provided in a region which is on an outer circumferential side of the termination trench 54 and is in a position in contact with the termination trench 54. The p-type outer circumference region 62 extends across a position exposed on the surface 72 and a position exposed on the surface 74. The p-type outer circumference region 62 is exposed on the surface 72, the step portion 70, and the surface 74. Further, the p-type outer circumference region 62 extends to a position deeper than the lower end of the termination trench 54. As shown in FIG. 2, in the present embodiment, the p-type lower end region 60 and the p-type outer circumference region 62 are connected to each other. Since the p-type lower end region 60 and the p-type outer circumference region 62 constitute a single p-type region, they may be hereinafter referred to collectively as a "p-type boundary region 59". That is, the p-type boundary region 59 is a p-type region that extends across a position exposed at the lower end of the termination trench 54, the position exposed on the surface 72, and the position exposed on the surface 74. As shown in FIG. 1, the p-type boundary region 59 is disposed so as to surround the entire periphery of the MOSFET region 20 along the termination trench 54. As shown in FIG. 2, the outer circumference drift region 28b is provided below the p-type boundary region 59.

Figure 3:
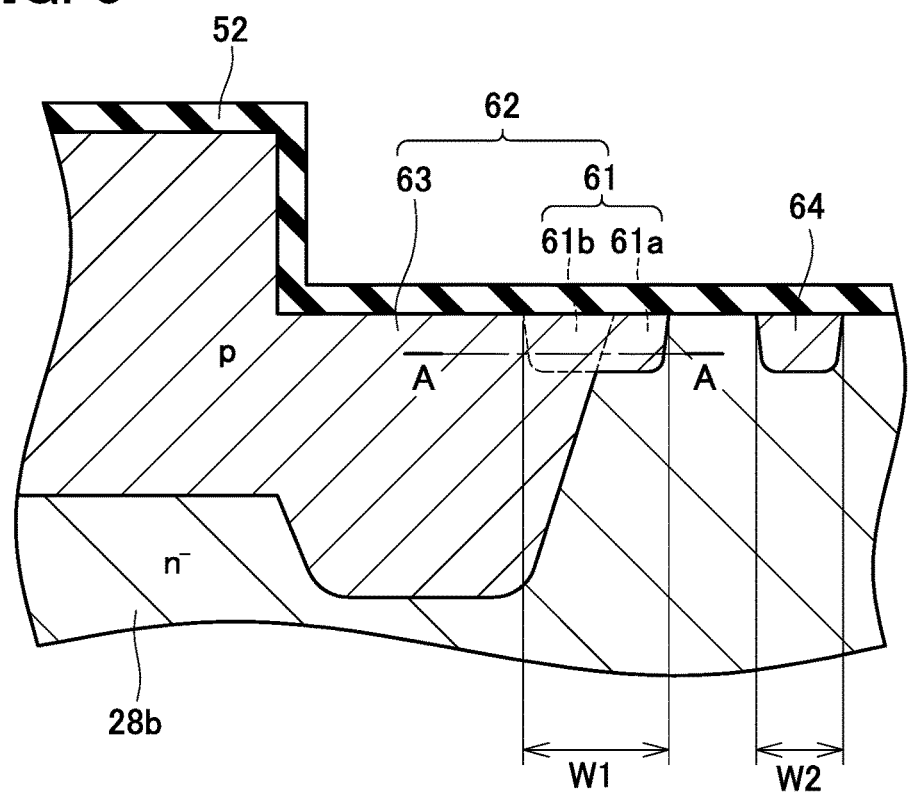
FIG. 3 is an enlarged cross-sectional view of a p-type outer circumference p-type region 62.
Figure 4:
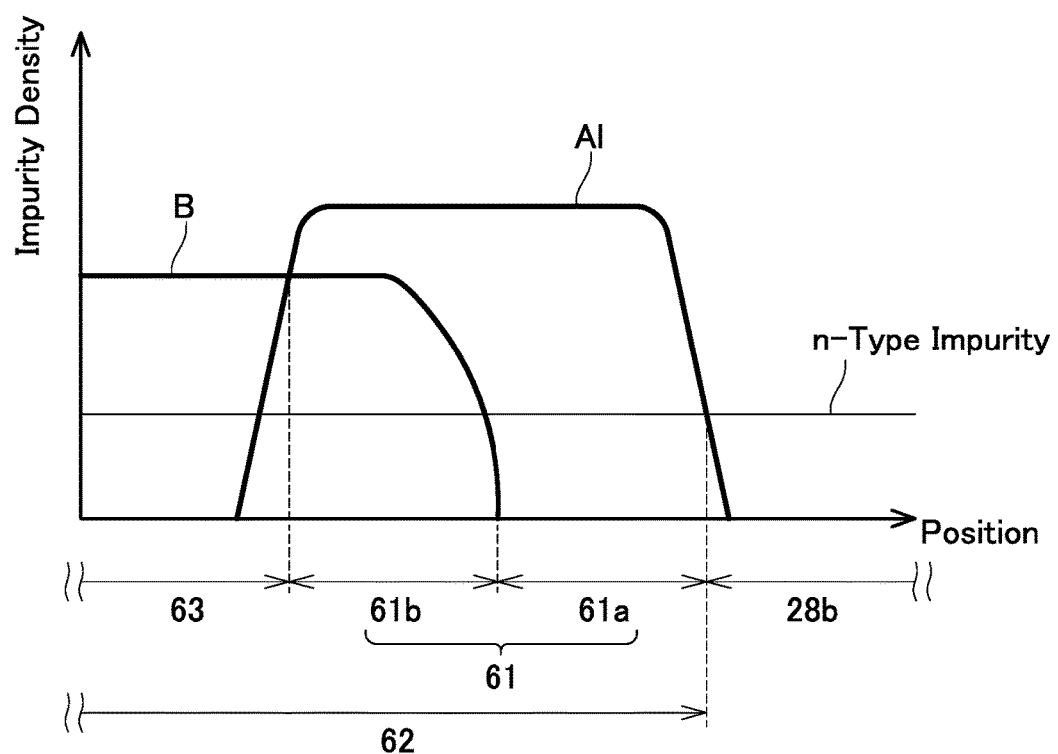
FIG. 4 is a graph showing a impurity density distribution along line A-A in FIG. 3.

FIG. 3 is an enlarged cross-sectional view of an outer circumferential end of the p-type outer circumference region 62 and a vicinity thereof. As shown, the p-type outer circumference region 62 comprises an Al (aluminum) high density region 61 and a B (boron) high density region 63. The Al high density region 61 is a p-type region having a density of Al higher than a density of B, and the B high density region 63 is a p-type region having a density of B higher than the density of Al. The p-type outer circumference region 62 does not contain p-type impurities other than B and Al, excluding uncontrollable error levels. The Al high density region 61 is provided in a range where the p-type outer circumference region 62 is exposed on the surface 74 and at its outer circumferential end of the p-type outer circumference region 62. The B high density region 63 is provided in the p-type outer circumference region 62 that does not involve the Al high density region 61. A large part of the p-type outer circumference region 62 is configured of the B high density region 63. FIG. 4 shows an impurity density distribution at the outer circumferential end of the p-type outer circumference region 62 and in the vicinity thereof (i.e. an impurity density distribution along the line A-A in FIG. 3). In FIGS. 3 and 4, a region 61a is a region that contains Al and does not contain B. A region 61b is a region that contains Al and B and has a density of Al higher that a density of B. The Al high density region 61 is configured of the region 61a and the region 61b. A width W1 of the Al high density region 61 shown in FIG. 3 (i.e. a dimension in a direction from an inner circumferential side toward the outer circumferential side) is wider than a width W2 of each of the guard ring regions 64 described below. It should be noted that the widths W1 and W2 mean dimensions in the direction from the inner circumferential side toward the outer circumferential side.

As shown in FIG. 2, the plurality of guard ring regions 64 is provided on the outer circumferential side of the p-type outer circumference region 62. Each of the guard ring regions 64 is a p-type region, and is provided in a range exposed on the surface 74. Each of the guard ring regions 64 is provided only in a shallow range. Therefore, a lower end of each of the guard ring regions 64 is located in an upper position (i.e. on a front surface side) than a lower end of the p-type outer circumference region 62. The outer circumference drift region 28b is provided below each of the guard ring regions 64. The outer circumference drift region 28b is also provided between the guard ring region 64 on an innermost circumferential side (i.e., a MOSFET region 20 side) and the p-type outer circumference region 62. The outer circumference drift region 28b separates the guard ring region 64 on the innermost circumferential side from the p-type outer circumference region 62. Further, the outer circumference drift region 28b is also provided between the adjacent guard ring regions 64. The outer circumference drift region 28b separates the guard ring regions 64 from each other. Each of the guard ring regions 64 contains Al as a p-type impurity. Each of the guard ring regions 64 does not contain p-type impurities other than Al, excluding uncontrollable error levels.

The following describes an operation of the semiconductor device 10. In operating the semiconductor device 10, a voltage that makes the drain electrode 38 positive is applied between the drain electrode 38 and the source electrode 36. Furthermore, application of a gate-on voltage to the gate electrodes 34c turns on the MOSFET in the MOSFET region 20. That is, a channel is formed in a part of the body region 26 that faces each gate electrode 34c, and a current flows from the source electrode 36 toward the drain electrode 38 via the source regions 22, the channel, the drift region 28, and the drain region 30. Termination of the application of the gate-on voltage to the gate electrodes 34c causes the channel to disappear, and the MOSFET is turned off. The turning off of the MOSFET causes a depletion layer to spread from a p-n junction at a boundary between the body region 26 and the drift region 28 into the drift region 28. Once the depletion layer reaches the p-type floating regions 32 provided in the MOSFET region 20, the depletion layer also spreads from the p-type floating regions 32 into the drift region 28. This efficiently depletes a part of the drift region 28 that is located between two p-type floating regions 32.

This suppresses a concentration of electric field in the MOSFET region 20. This achieves a high withstand voltage in the MOSFET region 20.

Further, the aforementioned depletion layer, which extends from the p-n junction, also reaches the p-type boundary region 59 below the termination trench 54 as indicated by an arrow 82 in FIG. 2. Then, the depletion layer spreads from the p-type boundary region 59 into the drift region 28. A part of the drift region 28 that is located between the gate trenches 34 and the termination trench 54 is depleted by the depletion layer spreading from the p-type floating regions 32 below the gate trenches 34 and the depletion layer spreading from the p-type boundary region 59 below the termination trench 54 (i.e. the p-type lower end region 60). At this occasion, since the gate trenches 34 and the termination trench 54 are substantially equal in depth to each other (that is, the p-type floating regions 32 and the p-type lower end region 60 are substantially equal in depth-direction position to each other), an equipotential line extends in a transverse direction (i.e. a direction parallel to the surface 72) in the part of the drift region 28 that is located between the gate trenches 34 and the termination trench 54. This suppresses a concentration of electric field in a vicinity of the termination trench 54.

Further, the p-type boundary region 59 extends from a range in contact with the lower end of the termination trench 54 to a position in contact with the surface 74 of the semiconductor substrate 12. Due to this, in a vicinity of the surface 74, the depletion layer spreads from the p-type boundary region 59 toward the guard ring region 64 on the innermost circumferential side. Once the depletion layer reaches the guard ring region 64 on the innermost circumferential side, the depletion layer extends from that guard ring region 64 to its adjacent guard ring region 64. In this manner, the depletion layer spreads to the outer circumferential side via each of the guard ring regions 64 in sequence. This allows the depletion layer to widely extend into the outer circumference region 50. This achieves a high withstand voltage in the outer circumference region 50.

Thus, in this semiconductor device, the p-type boundary region 59 below the termination trench 54 is provided in a position as deep as the p-type floating regions 32, and therefore concentration of electric field in a vicinity of the outer circumferential end of the MOSFET region 20 is suppressed. Further, since the p-type boundary region 59 extends from the bottom surface of the termination trench 54 to the surface 74 of the semiconductor substrate 12, on the outer circumferential side of the termination trench 54, the depletion layer can reach the guard ring regions 64 provided only in the shallow range in the vicinity of the surface 74. As a result, the extension of the depletion layer in the outer circumference region 50 is promoted by the plurality of guard ring regions 64. Further, since the guard ring regions 64 are separated from each other, potentials are evenly distributed in the outer circumference region 50. This achieves a high withstand voltage in the outer circumference region 50.

Further, in this semiconductor device, the Al high density region 61 is provided at the outer circumferential end of the p-type outer circumference region 62 and in the range exposed on the surface 74. Such provision of the Al high density region 61 makes it possible to suppress a leak current that passes through a vicinity of a surface of the p-type outer circumference region 62.

Figure 5:
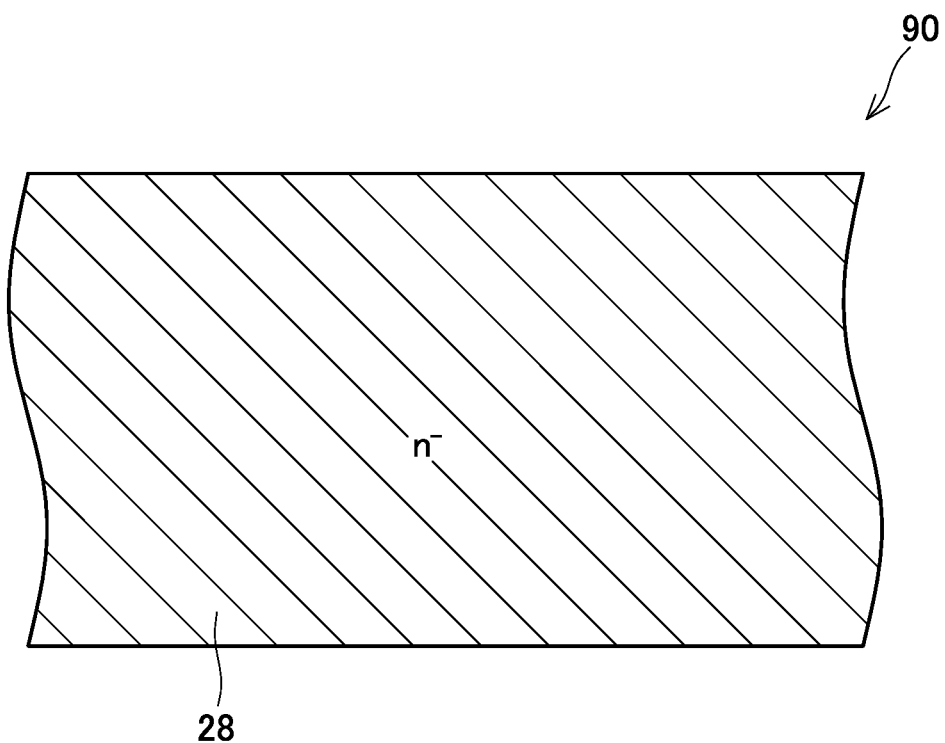
FIG. 5 is an explanatory diagram of a process of manufacturing a semiconductor device 10.
Figure 6:
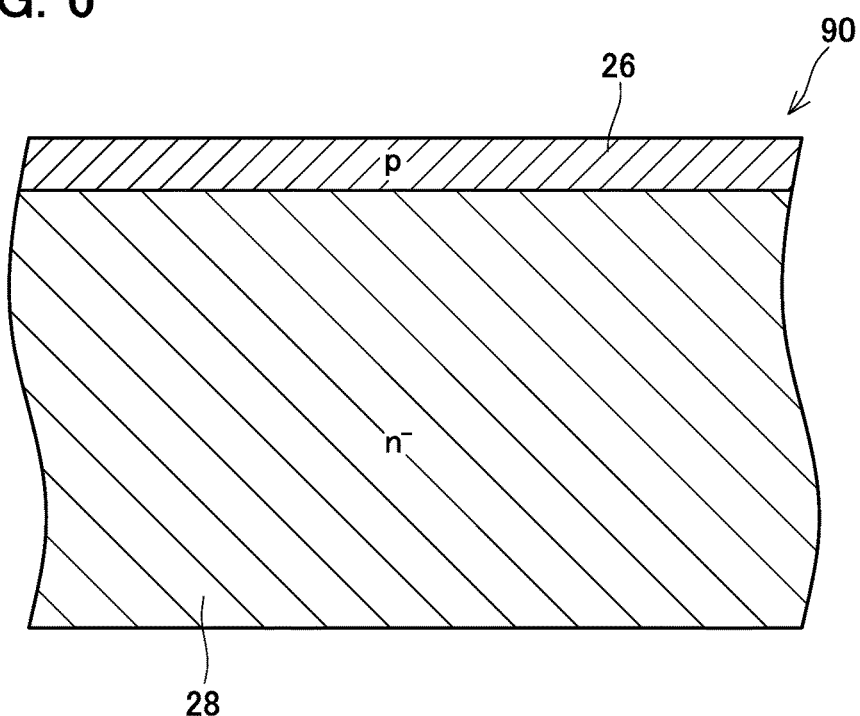
FIG. 6 is an explanatory diagram of the process of manufacturing the semiconductor device 10.
Figure 7:
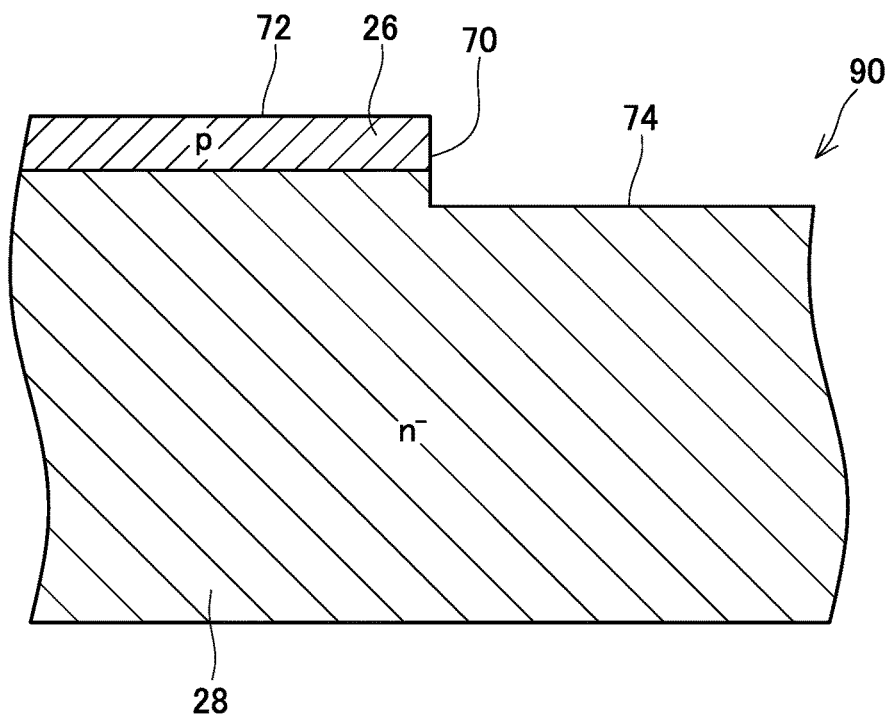
FIG. 7 is an explanatory diagram of the process of manufacturing the semiconductor device 10.

The following describes a method of manufacturing the semiconductor device 10. First, as shown in FIG. 5, a semiconductor wafer 90 composed solely of an n-type layer 28 is prepared. The n-type layer 28 is a region that is to become the drift region 28. Next, as shown in FIG. 6, a p-type layer 26 is formed on a surface of the n-type layer 28 by epitaxial growth. The p-type region 26 is a region that is to serve as the body region 26. Next, a surface of the semiconductor wafer 90 in a predetermined range is partially etched. In this step, the etching is performed so that the p-type layer 26 is removed and the n-type layer 28 is exposed in the etched range as shown in FIG. 7. This causes the step portion 70 to be formed on the surface of the semiconductor wafer 90. The step portion 70 divides the surface of the semiconductor wafer 90 into the surface 72 and the surface 74.

Figure 8:
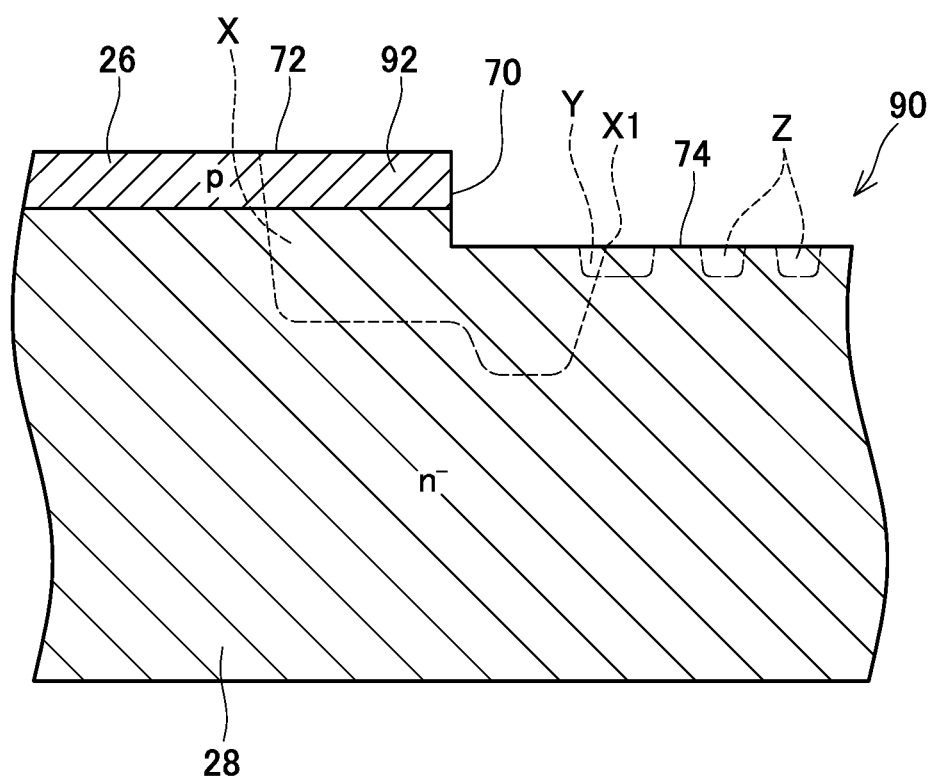
FIG. 8 is an explanatory diagram of the process of manufacturing the semiconductor device 10.

Next, ion implantation is performed on the p-type boundary region 59. That is, first, B is implanted in a range of the surface of the semiconductor wafer 90 that includes the step portion 70 (i.e. a range extending across the surface 72 and the surface 74). In this step, B is implanted, by adjusting implantation energy of B, so that B is distributed from a shallow position to a comparatively deep position as indicated by an implantation range X in FIG. 8. Next, Al is implanted in a range of the surface 74 of the semiconductor wafer 90 that includes an outer circumferential end X1 of the implantation range X (i.e. an implantation range Y in FIG. 8). In this step, Al is implanted, by setting implantation energy of Al low, so that Al is only implanted in the vicinity of the surface 74 of the semiconductor wafer 90.

Next, ion implantation is performed on the guard ring regions 64. That is, Al is implanted into a part of the surface 74 of the semiconductor wafer 90 that is located on the outer circumferential side of the implantation range Y (i.e. implantation ranges Z corresponding respectively to guard ring regions 64). In this step, Al is implanted, by setting the implantation energy of Al low, so that Al is only implanted in the vicinity of the surface 74 of the semiconductor wafer 90. It should be noted that the implantation ranges Z are narrower in width than the implantation range Y.

Figure 9:
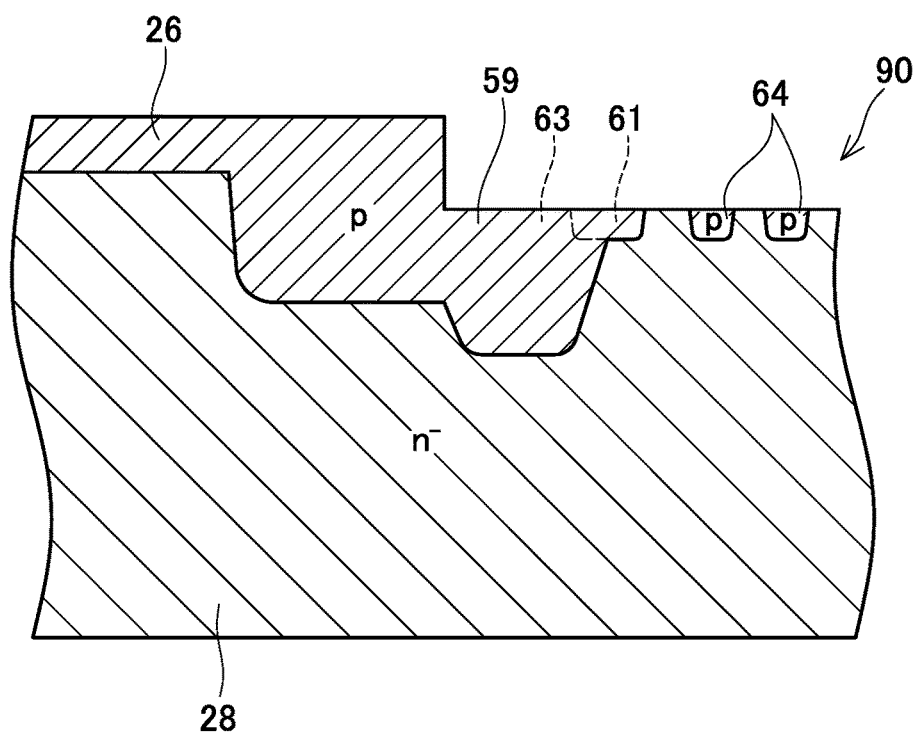
FIG. 9 is an explanatory diagram of the process of manufacturing the semiconductor device 10.

Next, the implanted Al and B are diffused and activated by heat-treating the semiconductor wafer 90. This causes the p-type boundary region 59 and the guard ring regions 64 to be formed as shown in FIG. 9. At this occasion, a distribution range of B widens since B has a larger coefficient of diffusion in SiC than Al does. That is, the range in which B thus diffused is distributed is much wider than the implantation range X. By having widened the width of the implantation range Y of Al as mentioned above, the Al high density region 61 can be easily placed at the outer circumferential end of the p-type boundary region 59 even if the distribution range of B expands. Further, since the guard ring regions 64 are formed in the shallow positions in the vicinity of the surface 74 of the semiconductor wafer 90, the guard ring regions 64 can be formed with a high degree of accuracy. In particular, since Al, which is implanted into the guard ring regions 64, has a low coefficient of diffusion in SiC, the guard ring regions 64 can be formed with a higher degree of accuracy. Therefore, intervals between the adjacent guard ring regions 64 can be narrowed. Furthermore, an interval between the p-type outer circumference region 62 and the guard ring regions 64 can be narrowed.

Figure 10:
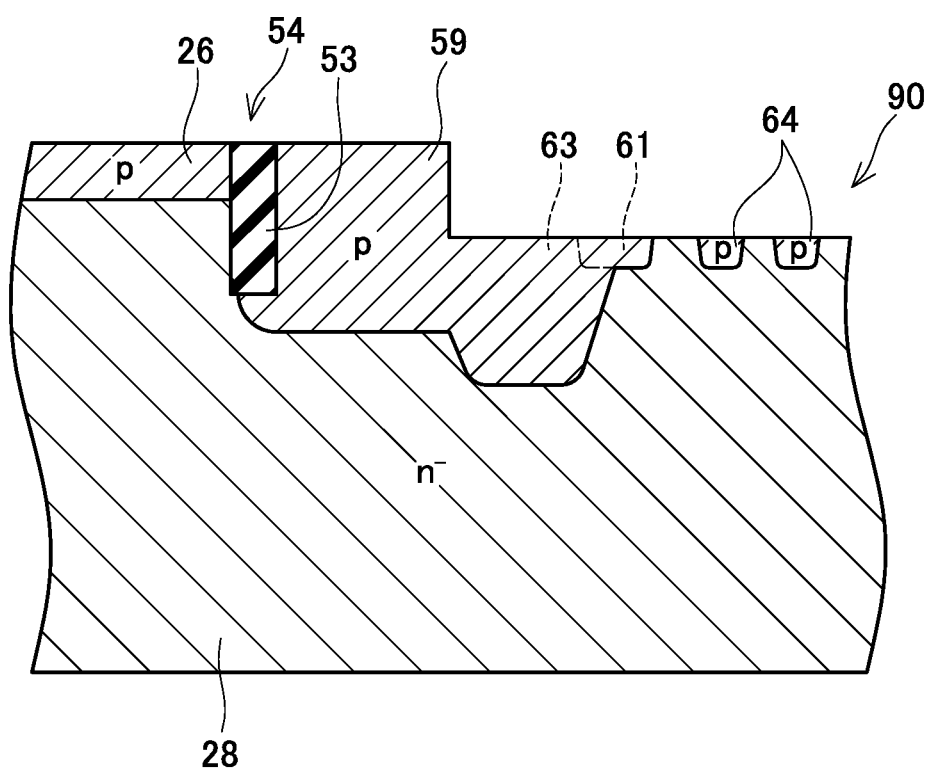
FIG. 10 is an explanatory diagram of the process of manufacturing the semiconductor device 10.

Next, as shown in FIG. 10, the termination trench 54 is formed at an end portion of the p-type outer circumference region 62 (i.e. an end opposite to the Al high density region 61), and the insulating layer 53 is formed in the termination trench 54.

Thereafter, the structures in the MOSFET region 20 are formed, and other necessary structures (such as diffusion layers, electrodes, and insulating layers) are formed, and the semiconductor device 10 shown in FIG. 1 is completed. It should be noted that the order of the steps of the manufacturing process described above can be changed as appropriate. Alternatively, the structures in the MOSFET region 20 may be formed before or at the same time as the structures in the outer circumference region 50.

As described above, this manufacturing method makes it possible to narrow the intervals between the adjacent guard ring regions 64, and also makes it possible to narrow the interval between the p-type outer circumference region 62 and the guard ring regions 64. Therefore, in this semiconductor device 10, the depletion layer easily extends into the outer circumference region 50. Due to this, this method makes it possible to manufacture the semiconductor device 10 with a high withstand voltage of the outer circumference region 50.

Figure 11:
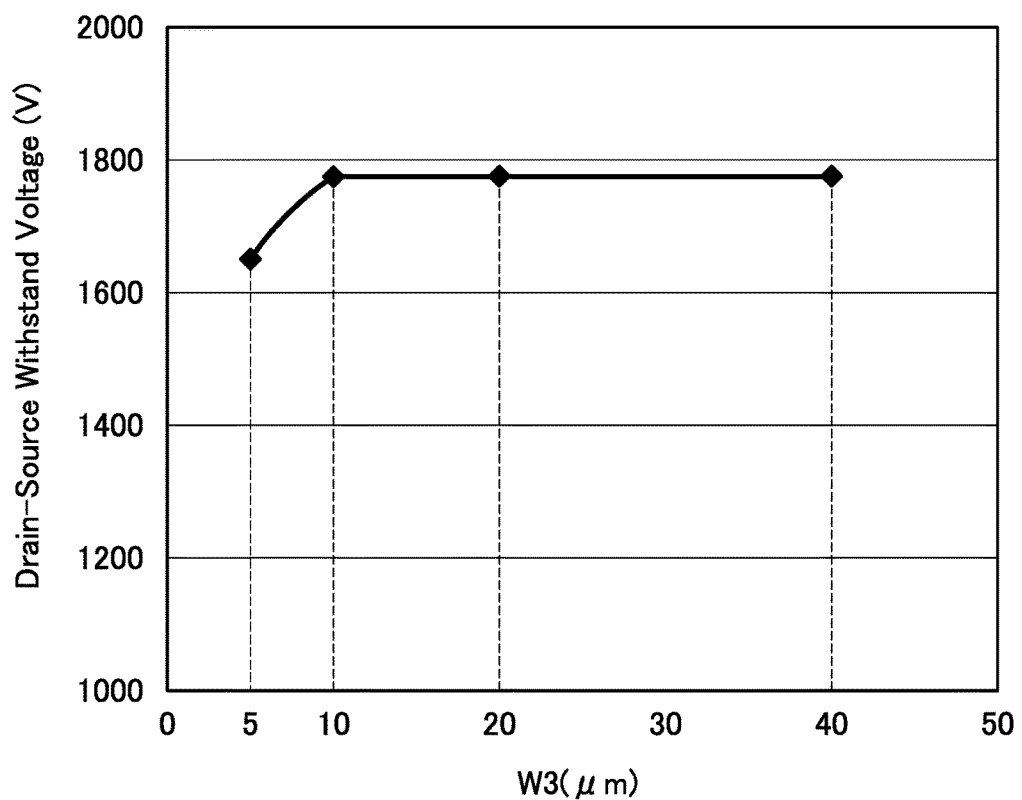
FIG. 11 is a graph showing a relationship between an interval W3 and a drain-source withstand voltage.

It should be noted that FIG. 11 shows a relationship between an interval W3 (see FIG. 2) between the termination trench 54 and the step portion 70 and a drain-source withstand voltage of the semiconductor device 10. As shown, the drain-source withstand voltage rapidly drops when the interval W3 becomes less than 10 µm. For this reason, it is preferable that the interval W3 is 10 µm or more.

Figure 12:
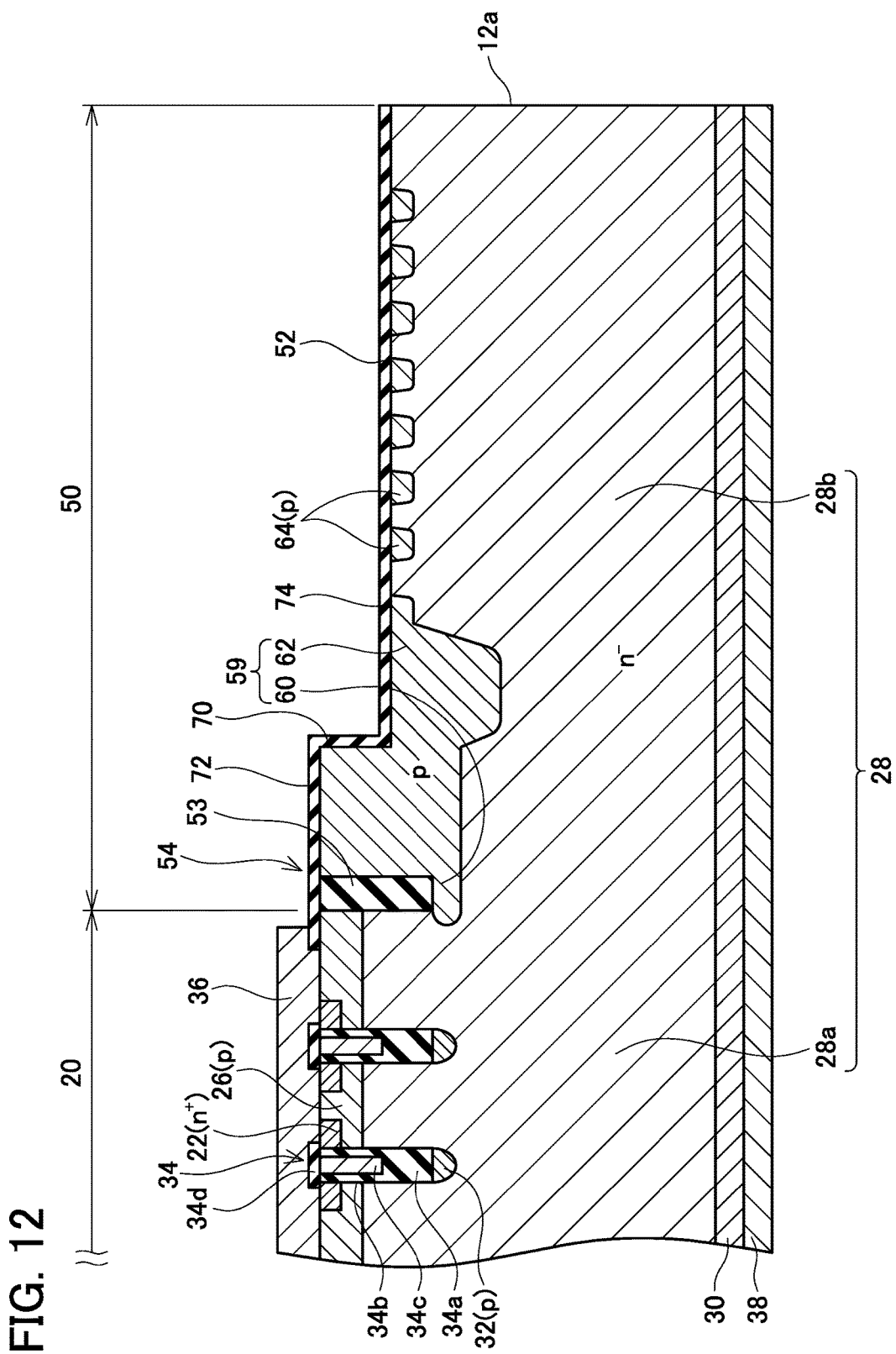
FIG. 12 is a longitudinal sectional view of a semiconductor device according to a first modification that corresponds to FIG. 2.
Figure 13:
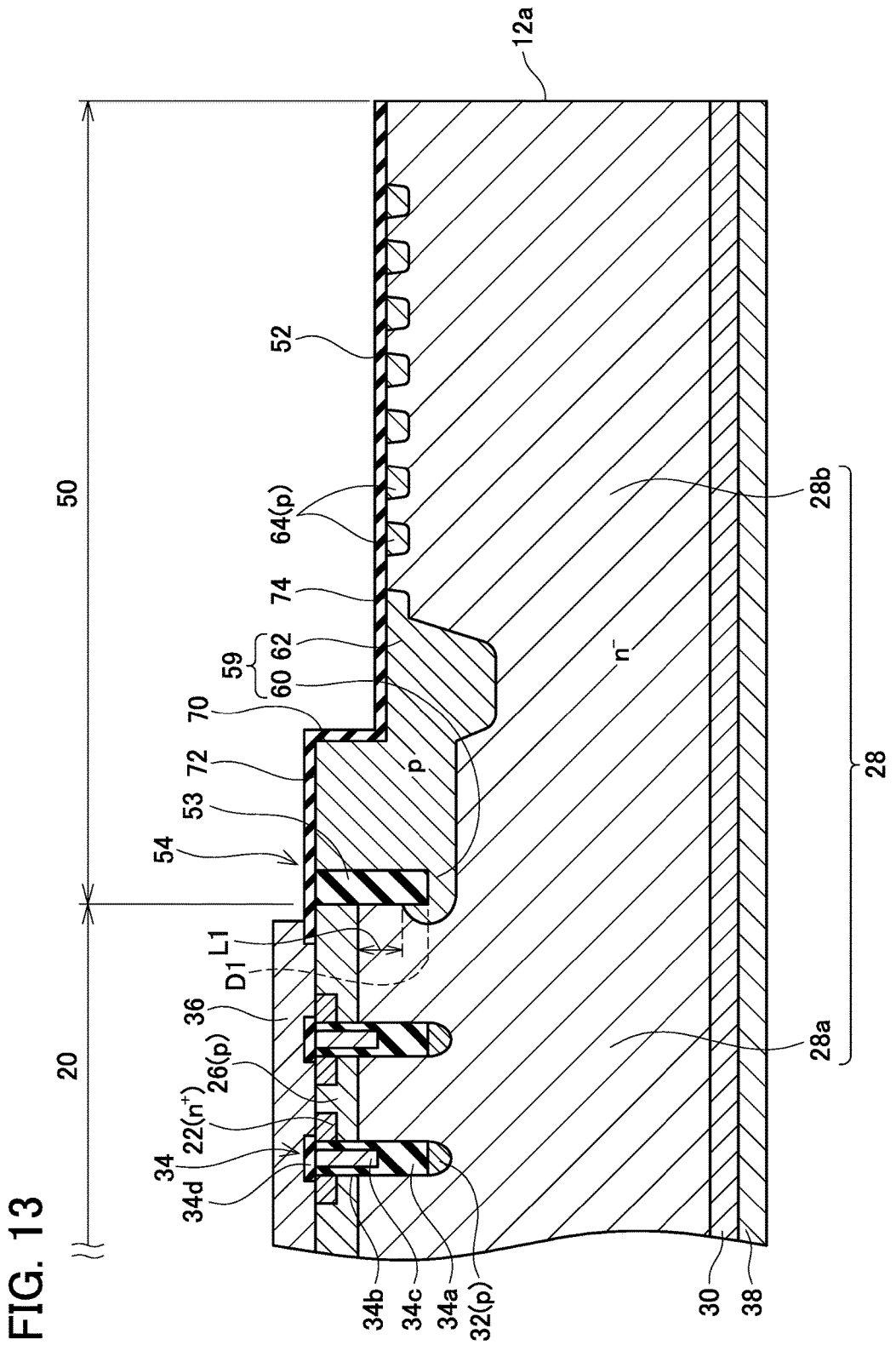
FIG. 13 is a longitudinal sectional view of a semiconductor device according to a second modification that corresponds to FIG. 2.

Further, in the semiconductor device 10 according to the embodiment described above, the p-type boundary region 59 below the termination trench 54 (i.e. the p-type lower end region 60) is not provided on the MOSFET region 20 side. Alternatively however, as shown in FIG. 12, a part of the p-type lower end region 60 may project to the MOSFET region 20 side with respect to the termination trench 54. Such a configuration makes it easy to deplete the part of the drift region 28 that is located between the gate trenches 34 and the termination trench 54. It should be noted that, it is preferable in this case that the projecting part does not protrude to an upper side (i.e. a body region 26 side) with respect to the lower end of the termination trench 54. That is, when, as shown in FIG. 13, a part of the p-type lower end region 60 is located on an upper side with respect to the depth D1 of the lower end of the termination trench 54 in the MOSFET region 20, a distance L1 between the p-type lower end region 60 and the body region 26 becomes shorter. When the distance L1 becomes shorter, the drain-source withstand voltage drops. Due to this, it is preferable that the part of the p-type lower end region 60 that is located in the MOSFET region 20 is present only on a lower side with respect to the lower end of the termination trench 54. Note, however, that, in some cases, the drain-source withstand voltage may be ensured by placing the part of the p-type lower end region 60 on the upper side with respect to the depth D1 so as to optimize the distance L1.

Figure 14:
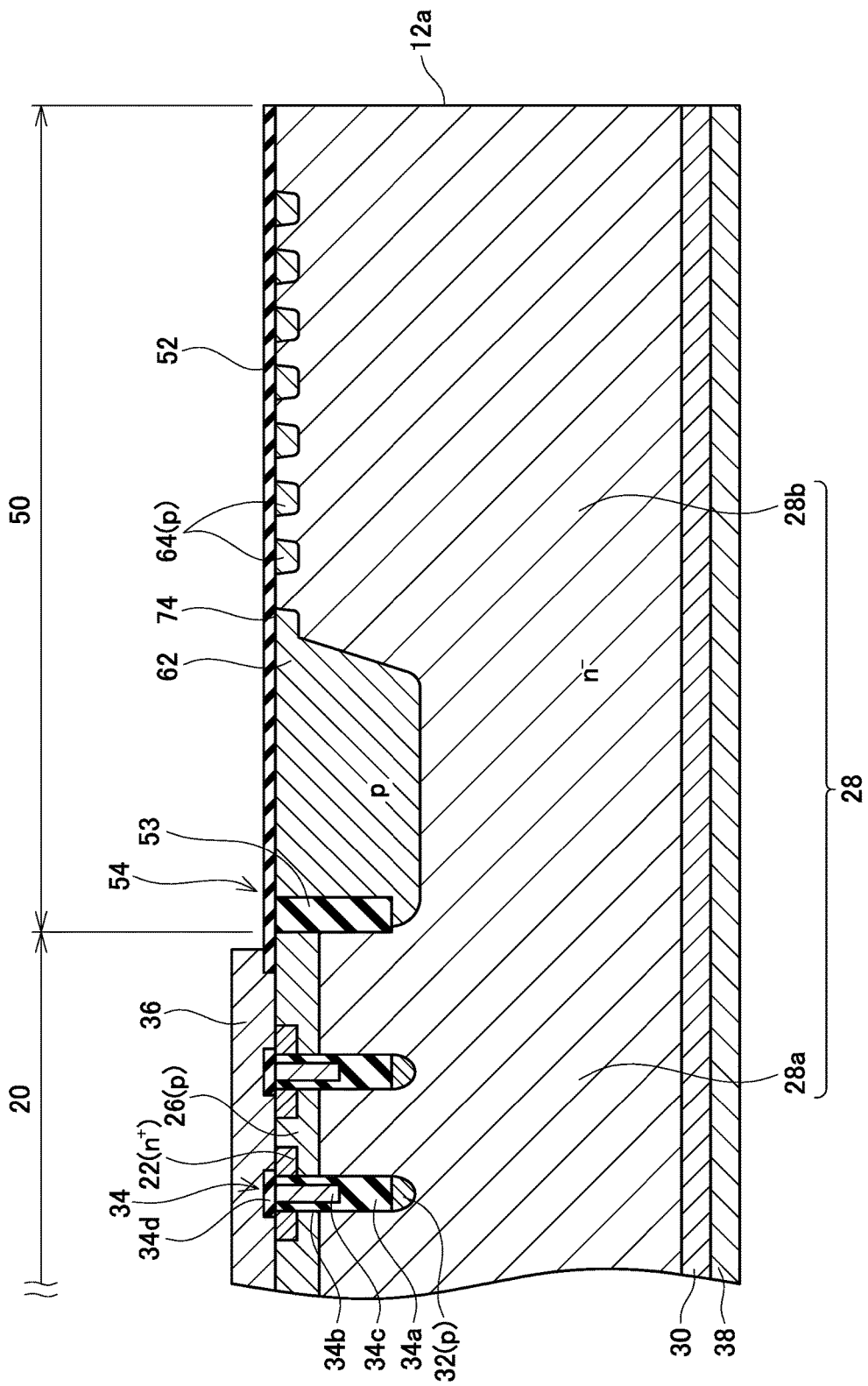
FIG. 14 is a longitudinal sectional view of a semiconductor device according to a third modification that corresponds to FIG. 2.

Further, in the semiconductor device 10 described above, the step portion 70 is provided on the surface of the semiconductor substrate 12. Alternatively, as shown in FIG. 14, the surface of the semiconductor substrate 12 may be flat. It should be noted that the body region 26 of the semiconductor device shown in FIG. 14 is formed by ion implantation. Unlike epitaxial growth, ion implantation allows the body region 26 to be formed only in a region in the surface of the semiconductor wafer where the body region 26 needs to be formed. Therefore, in a process of manufacturing the semiconductor device shown in FIG. 14, it is not necessary to execute the step of etching a part of the p-type layer 26 (i.e. the body region 26) described in the embodiment described above (i.e. the step of forming the step portion 70). Therefore, in the semiconductor device shown in FIG. 14, the surface of the semiconductor substrate 12 is flat.

Figure 15:
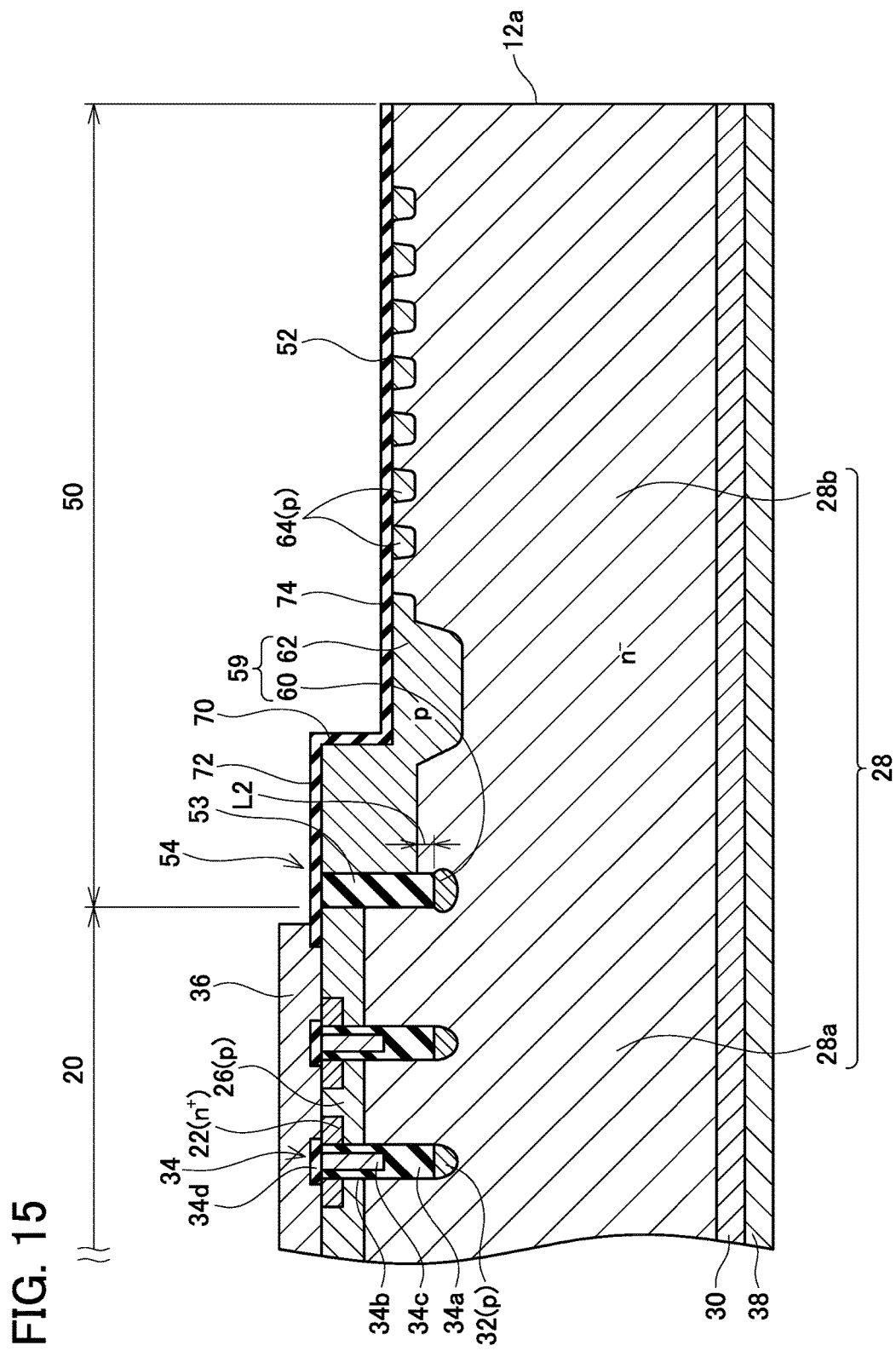
FIG. 15 is a longitudinal sectional view of a semiconductor device according to a fourth modification that corresponds to FIG. 2.

Further, in the embodiment described above, the p-type lower end region 60 is connected to the p-type outer circumference region 62. Alternatively, as shown in FIG. 15, the p-type lower end region 60 may be separated from the p-type outer circumference region 62. In FIG. 15, the p-type outer circumference region 62 is provided in a range shallower than the termination trench 54. Due to this, the p-type lower end region 60 is separated from the p-type outer circumference region 62 by the drift region 28. Even with such a configuration, the withstand voltage of the outer circumference region 50 can be ensured in the same manner as in the embodiment described above, provided a distance L2 between the p-type lower end region 60 and the p-type outer circumference region 62 is set to be a distance which allows the depletion layer to extend from the p-type lower end region 60 to the p-type outer circumference region 62. It should be noted that, in order for the depletion layer to extend, it is preferable that the distance L2 is set to satisfy an equation $L2 \leq \{2\epsilon(Vbi-V)/q \cdot Nb\}^{1/2}$, where $\epsilon$ is a dielectric constant of the drift region 28, Vbi is a built-in potential between the p-type lower end region 60 and the drift region 28, V is an applied voltage, q is an elementary electric charge, and Nb is an n-type impurity density of the drift region 28.

Further, the semiconductor device according to the embodiment described above includes a MOSFET. Alternatively, the MOSFET may be replaced by another element such as an IGBT. Further, in the embodiment described above, the semiconductor substrate 12 is constituted of SiC. Alternatively, a semiconductor substrate constituted of another material such as Si may be used.

The embodiments have been described in detail, in the above. However, these are only examples and do not limit the claims. The technology described in the claims includes various modifications and changes of the concrete examples represented above. The technical elements explained in the present description or drawings exert technical utility independently or in combination of some of them, and the combination is not limited to one described in the claims as filed. Moreover, the technology exemplified in the present description or drawings achieves a plurality of objects at the same time and has technical utility by achieving one of such objects.

The invention claimed is:

1. A semiconductor device that comprises a semiconductor substrate, the semiconductor device comprising:
    a first region of an n-type provided in the semiconductor substrate and exposed on a surface of the semiconductor substrate;
    a second region of a p-type provided below the first region;
    a third region of the n-type provided below the second region and separated from the first region by the second region;
    a plurality of gate trenches provided in the surface, penetrating the first region and the second region, and reaching the third region;
    first insulating layers provided in the gate trenches;
    gate electrodes provided in the gate trenches and facing the second region via the first insulating layers;
    fourth regions of the p-type being in contact with lower ends of the gate trenches;
    a termination trench provided in the surface and extending so as to surround a region in which the plurality of gate trenches is provided in a planar view of the surface;
    a second insulating layer provided in the termination trench;
    a p-type lower end region of the p-type being in contact with a lower end of the termination trench;
    a p-type outer circumference region of the p-type provided on an outer circumferential side of the termination trench, being in contact with the termination trench, and exposed on the surface;
    a plurality of guard ring regions of the p-type provided on the outer circumferential side of the p-type outer circumference region and exposed on the surface; and
    an n-type outer circumference region of the n-type provided on the outer circumferential side of the termination trench, connected to the third region, separating the p-type outer circumference region from the guard ring regions, and separating the guard ring regions from each another,
    wherein
    a step portion is provided on the surface so that the surface comprises a first surface and a second surface projecting from the first surface,
    the termination trench is provided in the second surface,
    the p-type outer circumference region is exposed in a range extending across the second surface and the first surface, and
    the plurality of guard ring regions is exposed on the first surface.

2. The semiconductor device of claim 1, wherein an interval between the termination trench and the step portion is equal to or more than 10 μm.

3. The semiconductor device of claim 1, wherein the p-type outer circumference region includes:
    an Al high density region located in a region at an outer circumferential side end portion of the p-type outer circumference region and exposed on the surface, and having a density of Al higher than a density of B, and
    a B high density region bordering the Al high density region and having a density of B higher than a density of Al.

4. The semiconductor device of claim 3, wherein a width of the Al high density region is wider than a width of each of the guard ring regions.

5. The semiconductor device of claim 1, wherein
    a part of the p-type lower end region extends in a range provided on an inner circumferential side of the termination trench, and
    the part of the p-type lower end region extending in the range provided on the inner circumferential side of the termination trench does not extend to an upper side with respect to the lower end of the termination trench.

6. The semiconductor device of claim 1, wherein the guard ring regions contain Al.

7. A method of manufacturing the semiconductor device of claim 1, the method comprising steps of:
    growing a p-type layer on an n-type layer;
    removing a part of the p-type layer so as to form a surface on which the n-type layer is exposed and a surface on which the p-type layer is exposed and projecting from the surface on which the n-type layer is exposed;
    implanting p-type impurities in a range extending across the surface on which the n-type layer is exposed and the surface on which the p-type layer is exposed so as to form the p-type outer circumference region;
    implanting p-type impurities into the surface on which the n-type layer is exposed so as to form the guard ring regions; and forming the termination trench in the surface on which the p-type layer is exposed.

* * * * *